(12) United States Patent
Klevens

(10) Patent No.: US 6,798,214 B1
(45) Date of Patent: Sep. 28, 2004

(54) SELF-ADJUSTING RESISTANCE STANDARD

(75) Inventor: Jay E. Klevens, Pittsburgh, PA (US)

(73) Assignee: Process Instruments, Inc., Pittsburgh, PA (US)

(*) Notice: Subject to any disclaimer, the term of this patent is extended or adjusted under 35 U.S.C. 154(b) by 106 days.

(21) Appl. No.: 10/261,731

(22) Filed: Oct. 1, 2002

(51) Int. Cl.[7] .................. G01R 31/02; G01R 35/00
(52) U.S. Cl. ........................ 324/549; 324/601
(58) Field of Search .................. 324/549, 601, 324/703; 338/22 R, 31; 700/299, 300; 374/1; 702/57, 65, 75, 99, 106, 107, 117, 130, 132, 133, 136, 183, 184

(56) References Cited

U.S. PATENT DOCUMENTS

| | | |
|---|---|---|
| 3,609,537 A | 9/1971 | Healy |
| 3,719,914 A | 3/1973 | Scharle |
| 3,725,685 A * | 4/1973 | Bourgoin et al. ......... 324/601 |
| 4,335,349 A | 6/1982 | Baldock et al. |
| 5,369,371 A | 11/1994 | Eaton |
| 5,402,082 A | 3/1995 | Eccleston et al. |
| 5,481,199 A | 1/1996 | Anderson et al. |
| 6,434,504 B1 * | 8/2002 | Eryurek et al. ......... 702/130 |

* cited by examiner

Primary Examiner—Anjan Deb
Assistant Examiner—Timothy J. Dole
(74) Attorney, Agent, or Firm—Thorp Reed & Armstrong, LLP

(57) ABSTRACT

One aspect of the present invention relates to a digitally controlled resistance standard, comprising a control system, a resistor element, hermetically sealed within an element assembly, a temperature/frequency measuring circuit for measuring the temperature of the resistor element and the frequency of an input signal, a heating/cooling assembly for raising and lowering the temperature of the resistor element a temperature controller for controlling the heating/cooling assembly, and a control system having a CPU. The control system is operable to execute computer instructions for storing the baseline characteristics of the resistor element, retrieve the temperature of the resistor element from the temperature/frequency measuring circuit, determine the actual resistance value of the resistor element, and adjust the actual resistance value of the resistor element to match a target resistance value using the temperature controller. A method for improving the accuracy of a resistance standard is also given.

20 Claims, 9 Drawing Sheets

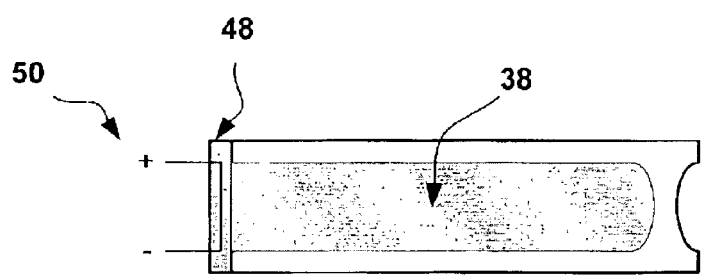 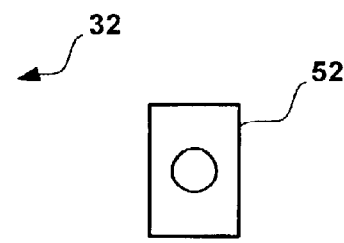
FIG 4A  FIG 4A-1
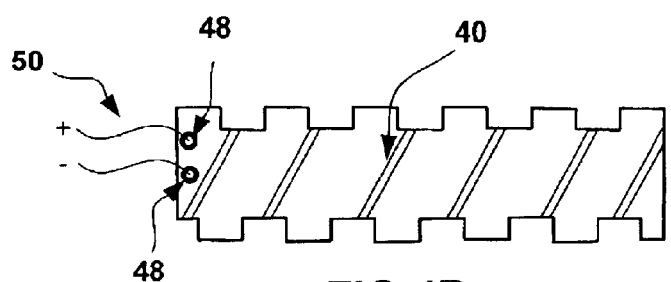 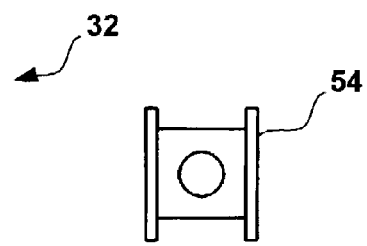
FIG 4B  FIG 4B-1

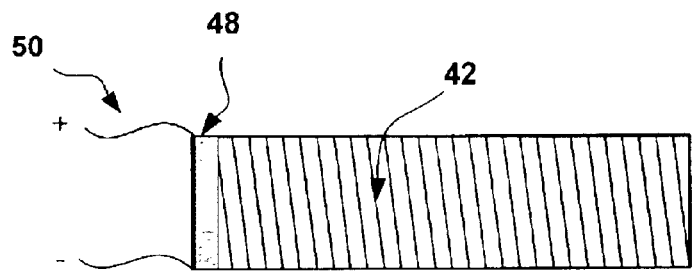
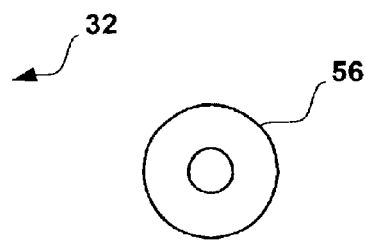
FIG 4C  FIG 4C-1
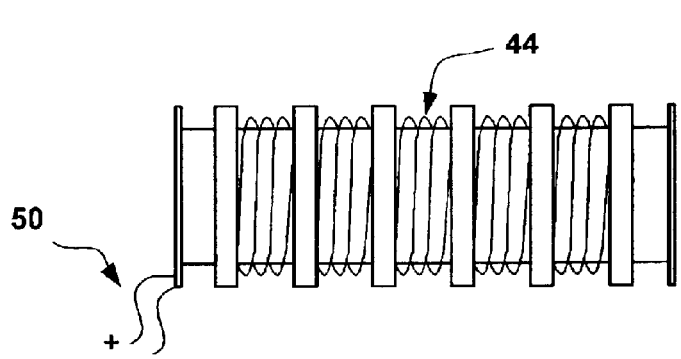
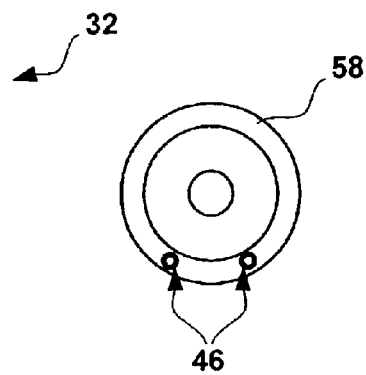
FIG 4D  FIG 4D-1

SELF-ADJUSTING RESISTANCE STANDARD

FIELD OF THE INVENTION

The present invention relates generally to measurement standards and more particularly to a portable resistance standard capable of adjusting its actual value to a nominal value.

BACKGROUND

The unit of measurement for resistance is an ohm. The legal ohm is defined by an agreement between national laboratories on the value of the Quantum Hall Effect Resistor (QHR), a fixed reference value which cannot be adjusted. Once the value of the ohm is established, the value is disseminated to a number of working standard resistors via Cryogenic Current Comparators (CCC's). The working standard resistors are then compared against other resistance standards sent in for calibration by commercial, private, or other public laboratories. The cost, size and sensitivity of QHR's and CCC's does not permit their easy transport. Thus in practice, the legal ohm is disseminated by the transport and maintenance of passive resistance standards.

Prior art passive resistance standards are affected by external environmental and measurement system effects. For example, temperature, relative humidity, barometric pressure, self-heating and thermoelectric effects caused by an applied current, inductive effects at varying frequencies, and drift due to aging, among others, each have an effect on prior art resistance standards. To minimize some of these effects, prior art resistance standards are typically placed in a constant temperature oil or air bath. Constant temperature baths, however, are large, non-portable, and expensive to maintain and monitor.

Higher quality resistance standards are typically constructed of Manganin or Evanohm® wire, strip, or ribbon, which is heat treated to reduce the material's coefficient of temperature. The standards are manufactured to possess low thermoelectric and inductive effects and hermetically sealed to reduce the effects of humidity and barometric pressure changes. High quality resistance standards, however, require a constant temperature bath to reduce temperature effects. Additionally, high quality resistance standards are easily damaged by excessive current, exhibit drift with age, and provide no means of testing the effects of the other components in a complete measurement system. Furthermore, the accuracy of high quality resistance standards is degraded by self heating during measurement and by measurement signals other than DC or low frequency AC signals. The working uncertainty of high quality resistance standards is also laborious to calculate and maintain.

High quality resistance standards are only capable of realizing a single resistance value; thus multiple high quality resistance standards must be used for each resistance value. For example, two high quality resistance standards must be used to generate a 0.01 ohm value and a 1 ohm value. The use of multiple high quality resistance standards increases the expense, size, and complexity of the complete measurement system.

Thus, there exists a need for a resistance standard having improved accuracy, that is more immune to external environmental and measurement system effects, that does not require the use of constant temperature baths, that can realize multiple resistance values, that integrates uncertainty calculations into its value, and that overcomes other limitations inherent in prior art resistance standards.

SUMMARY

One aspect of the present invention relates to a method for improving the accuracy of a resistance standard comprising ascertaining baseline characteristics for a resistor element, determining the actual resistance value of the resistor element, selecting a target resistance value for the resistor element, and adjusting the actual resistance value of the resistor element to match the target resistance value of the resistor element.

Ascertaining the baseline characteristics for the resistor element may further comprise at least one of determining the resistor element's coefficients of temperature; measuring the resistor element's frequency response; and determining the resistor element's drift due to age.

Additionally, determining the actual resistance value of the resistor element may further comprise determining the temperature of the resistor element, determining the frequency of an applied measurement signal, determining the age of the resistance standard, and calculating the actual resistance value of the resistor element using at least one of the measured temperature, frequency, and age, and the baseline characteristics. Adjusting the actual resistance value of the resistor element may comprise altering the temperature of the resistor element to realize the target resistance value.

Another aspect of the present invention relates to a self-adjusting resistance standard comprising a resistor element sealed within an element assembly, a temperature and frequency measuring circuit for measuring the temperature of the resistor element and the frequency of an applied measurement signal, a heating/cooling assembly for raising and lowering the temperature of the resistor element, a temperature controller for controlling the heating/cooling assembly, and a control system responsive to the measuring circuit to control the heating/cooling assembly to maintain the value of the resistor element. The control system may include a CPU and is operable to store the baseline characteristics of the resistor element, retrieve the temperature of the resistor element from the temperature/frequency measuring circuit, retrieve the frequency response of the resistor element, retrieve the frequency of an applied measurement signal, store uncertainty components, calculate expanded uncertainties, determine the actual resistance value of the resistor element, and adjust the actual resistance value of the resistor element to match a target resistance value using the temperature controller. The CPU also stores measurement system uncertainty components and calculates system uncertainty.

The present invention provides a resistance standard having improved accuracy, that is immune to external environmental and measurement system effects, that does not require the use of constant temperature baths, that contains multiple resistance values, that permits evaluation of measurement system sensitivity and accuracy, that includes uncertainty calculation, and that overcomes other limitations inherent in prior art resistance standards. Those advantages and benefits, and others, will be apparent from the Detailed Description below.

BRIEF DESCRIPTION OF THE DRAWINGS

To enable the present invention to be easily understood and readily practiced, the present invention will now be described for purposes of illustration and not limitation, in connection with the following figures wherein:

FIGS. 4A through 4D are detailed views of resistor elements for the element assembly of FIG. 3 according to various embodiments of the present invention.

FIGS. 4A-1, 4B-1, 4C-1 and 4D-1 are detailed end views of the resistor elements shown in FIGS. 4A, 4B, 4C, and 4D, respectively.

DETAILED DESCRIPTION

Figure 1:
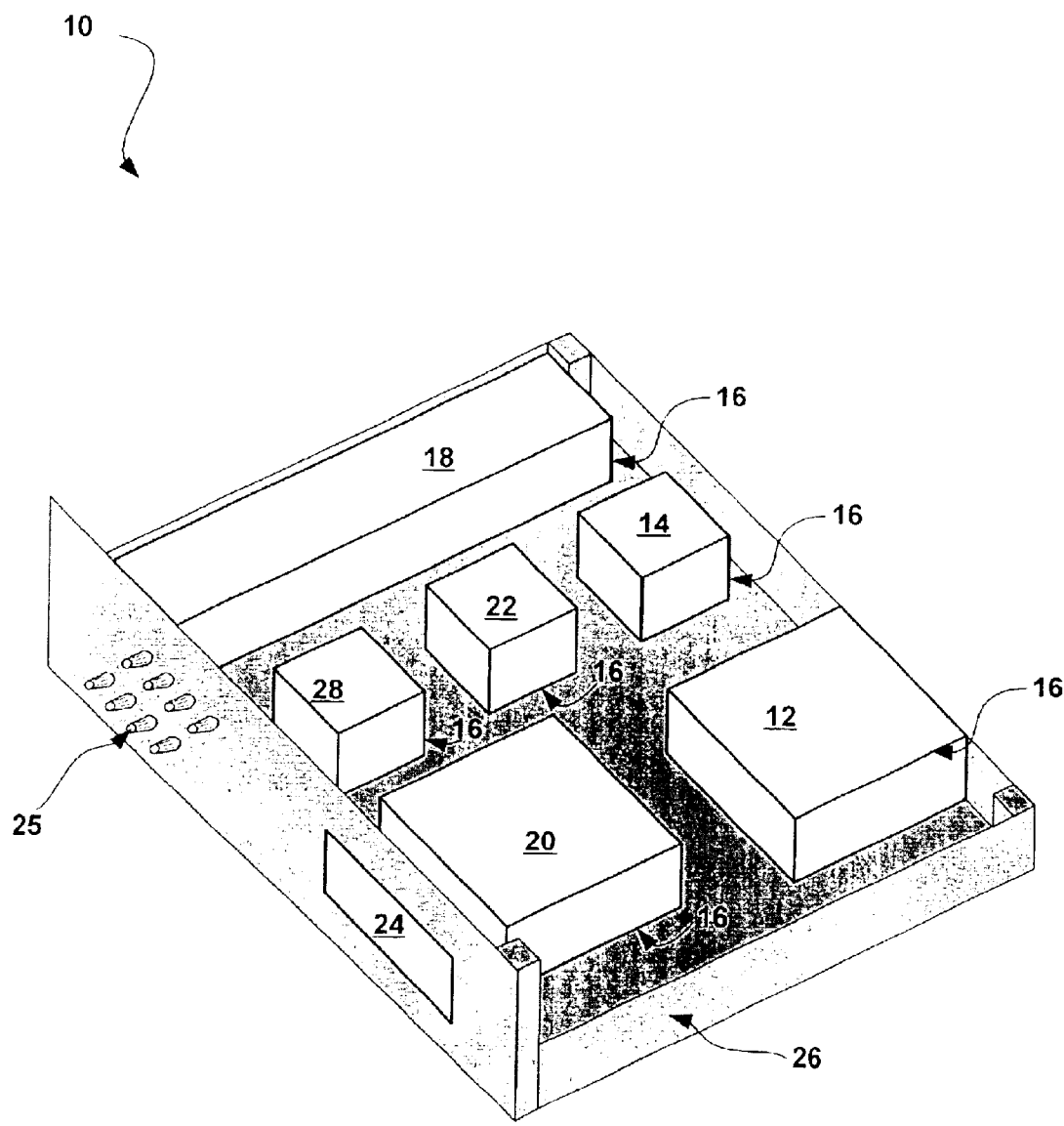
FIG. 1 is a perspective view of a digitally controlled resistance standard according to an embodiment of the present invention.
Figure 2:
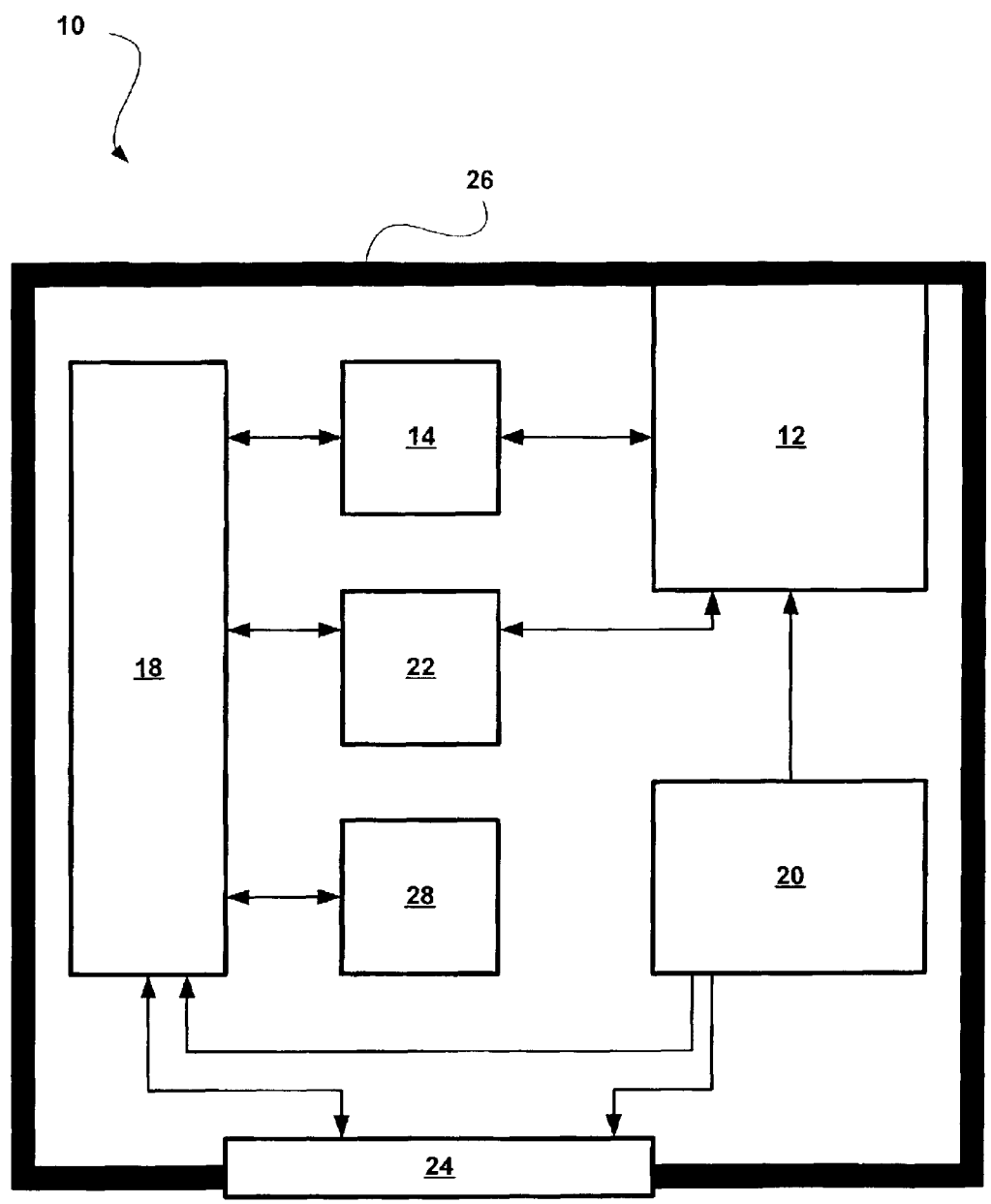
FIG. 2 is a simplified block diagram of the digitally controlled resistance standard of FIG. 1 according to an embodiment of the present invention.

FIGS. 1 and 2 are a perspective view and a simplified block diagram, respectively, of a digitally controlled resistance standard 10 according to an embodiment of the present invention. The digitally controlled resistance standard 10 is comprised of a heating/cooling assembly 12, a temperature/frequency measuring circuit 14, control system 18, power supply 20, temperature controller 22, one or more displays 24, user terminals 25, and memory 28. Each component (as shown in FIG. 1) of the digitally controlled resistance standard 10 may be individually protected against noise and other environmental effects by a shield 16. Alternatively, several components may be contained within a single shield 16, for example, the heating/cooling assembly 12 and temperature/frequency circuit 14 may be protected by the same shield.

In the current embodiment (and as described in more detail in conjunction with FIGS. 6A and 6B), heating/cooling assembly 12 is comprised of a shell 90, heat sinks 92, thermoelectric modules 94, fan mount 96, fan 98, and insulation 99 among others. In the current embodiment, the heating/cooling assembly 12 surrounds an element assembly 74. The element assembly 74 (as described in more detail in conjunction with FIGS. 3–5C), is comprised of a housing body 76, thermometer well assembly 78, end cap 80, and resistor element 32, among others.

In the current embodiment, control system 18 is comprised of a CPU and other circuit components (such as analog-to-digital converters, digital-to-analog converters, transistors, capacitors, and resistors, among others). The control system 18 is operable to execute a software program for achieving the resistance value's storage, display, control, and output functions of the present invention. In the current embodiment, the control system is operable to execute software functions for elapsed time measurement (which is based on comparing a current calendar reading to the resistor element's 32 date of manufacture) and uncertainty calculations (which are based on internal and external manufacturer and customer supplied data). It should be noted that internal information includes resistor element 32 data and system's 10 information. External information refers to customer supplied data. A more complete description of the software's functioning will be discussed in conjunction with FIG. 8 and operational process 800.

It should further be noted that control circuit 18 is operable to calculate the expanded uncertainty of the resistor element 32. Expanded uncertainty refers to a statistical valuation (for example, the root square sum) of all defined uncertainty components. For example: the uncertainty of a measurement at one ohm might be 1 part per million; the uncertainty of temperature measurement may be 0.01°, and 0.01° may correspond to a resistance change of 0.1 ppm. Each component may contribute a defined uncertainty. Combining the uncertainty for each components gives the expanded uncertainty.

Memory 28 is any combination of programmable volatile and non-volatile memory components. For example, RAM, ROM, DRAM, SDRAM, DDRAM, and FLASH memory, among others, may be used by the digitally controlled resistance standard 10 while remaining within the scope of the present invention. Memory 28 is operable to store data, for example manufacturer and user data, sent from the CPU and to return data requested by the CPU. It should be noted that other storage devices (for example, CD ROM drive, magnetic tape drive, hard disc drive, floppy disc drive, etc.) may be used while remaining within the scope of the present invention.

Temperature/frequency measuring circuit 14 measures the temperature of the element assembly 74 (see FIG. 3) and the frequency of a signal applied at user terminals 25. User terminals 25 include, for example, current and potential measurement connection terminals, among others. Temperature/frequency measuring circuit 14 provides outputs, for example digital outputs, to the control system 18.

In the current embodiment, the frequency measuring portion of the temperature/frequency measuring circuit 14 is comprised of an opto-isolator and an analog to digital (A/D) converter. The opto-isolator isolates the frequency measuring portion from a signal applied to user terminals 25. The output of the A/D converter is processed by the CPU.

In the current embodiment, the temperature measuring portion of the temperature/frequency measuring circuit 14 is a dual element Wheatstone bridge circuit with a constant current supply. The output of the temperature measuring portion is transmitted to an A/D converter and processed by the CPU. The CPU calculates the temperature using a Steinhart-Hart equation. In the current embodiment, the accuracy of the temperature can be resolved to better than one millidegree (i.e., 0.001° C.). It should be noted that other types of circuits may be used to measure the temperature and frequency while remaining within the scope of the present invention.

Temperature controller 22 includes logic circuitry (such as a processor, digital-to-analog converters, analog-to-digital converters, transistors, multiplexers, and bi-power amplifiers, among others) (not shown) for executing a tuned temperature control algorithm. In the current embodiment, the tuned temperature control algorithm is a PID algorithm which generates a numerical error output signal which is converted to an analog signal by a digital-to-analog converter. The analog signal controls the power output of a bipolar power amplifier. The amplified analog signal is sent to thermoelectric modules 94 of the heating/cooling assembly 12 (see FIGS. 6A and 6B).

In the current embodiment, the thermoelectric modules 94 are Peltier-effect devices which generate heat on one surface and remove heat from the opposite surface when a current is applied. A positive polarity signal from the temperature controller 22 bi-polar amplifier causes the thermoelectric modules 94 to heat the element assembly 74; a negative polarity signal from the temperature controller 22 bi-polar amplifier cools the element assembly 74. The power supplied to the temperature controller 22 bi-polar amplifier (and thus, the power supplied to the thermoelectric modules 94) may be limited to avoid damaging the resistor element 32. Additionally, to extend the life of the thermoelectric modules 94, a pulsed signal may be used. It should be noted that the CPU of the control system 12 may be used to execute the tuned temperature control algorithm while remaining within the scope of the present invention. It should further be noted that electrical shielding 16 may be used to isolate noise generated by the temperature controller 22 from the measurement terminals 25.

Power supply 20 is any commercially available or custom made power unit. In the current embodiment, a 10 volt/60 hertz commercially available power supply 20, is used. The power supply 20 is sized to supply all of the necessary power to the digitally controlled resistance standard 10. It should be noted that multiple power supplies may be used instead of a single power supply while remaining within the scope of the present invention. Furthermore, a power supply operating at a different voltage (e.g., 220 volts) and a different frequency (e.g., 50 hertz) may be used while remaining within the scope of the present invention.

One or more displays 24 are used to display information from the digitally controlled resistance standard 10. The displays 24 may be any commercially available device. For example, liquid crystal displays (LCD), light emitting diode (LED) displays, touch screen displays, etc. may be used while remaining within the scope of the present invention. Displays 24 may be controlled directly by the control system 18 or via separate display driver cards.

Although not shown in FIGS. 1 and 2, digitally controlled resistance standard 10 also includes one or more communication ports (for example, serial and parallel ports, etc.), input devices (for example, a keyboard, touchpad, and a mouse, etc), and measurement input devices (for example, thermometers, barometers, etc.). The communication ports are operable to connect the digitally controlled resistance standard 10 to a network, computer system, peripheral devices, and measurement systems, among others. The input devices are operable to accept user commands and data entry, among others. The measurement input devices are operable to measure and input external environmental levels (for example, temperature, pressure, humidity, etc), among others.

In the current embodiment, the components of the digitally controlled resistance standard 10 are contained within and supported by chassis 26. Chassis 26 has front, back, top, bottom, and side panels (for simplicity, not all of which are shown in FIGS. 1 and 2). The front panel of the chassis 26 supports the displays 24, and connection terminals 25. The rear panel of the chassis 26 has a fused power entry module with universal select switch, redundant connection terminals 25 (for rear panel connection), communication port(s), and a filtered cooling fan exhaust, among others (not shown). Indicator lights, power switches, and element select buttons, among others may also be supported by chassis 26. The chassis 26 may be constructed for rack mounting, bench top use, and field use, among others In the current embodiment, the digitally controlled resistance standard 10 is specified to operate with no measurable degradation in accuracy between temperatures of 15° C. and 35° C., between 5% and 95% relative humidity, and between pressures of 105.15 and 69.64 kilopascals (i.e., −1000 to 10,000 feet of elevation).

Figure 3:
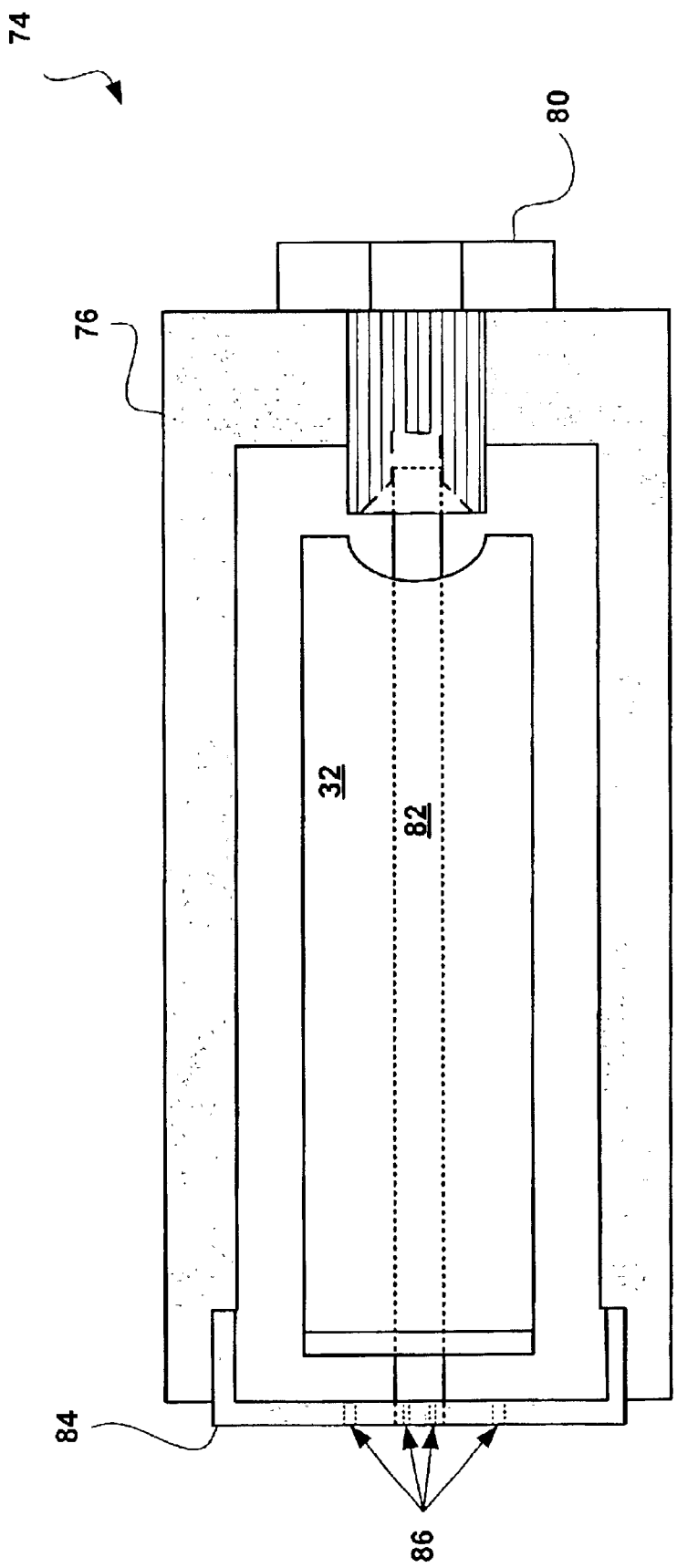
FIG. 3 illustrates an element assembly for the digitally controlled resistance standard of FIG. 1 according to an embodiment of the present invention.

FIG. 3 illustrates an element assembly 74 within heating cooling assembly 12 of FIG. 1 according to an embodiment of the present invention. The element assembly 74 is comprised of a housing body 76, a thermometer well assembly 78 (comprised of a thermometer well 82 and a flange 84 and illustrated in FIG. 5B), an end cap 80, the resistor element 32, and a temperature sensing device (not shown). In the preferred embodiment, electrical lead wires are supplied which connect the temperature sensing device and the resistor elements to the temperature/frequency measuring circuit 14, among others. The element assembly 74 may include glass to metal seals through which the lead wires pass. The resistor element 32 is hermetically sealed within the housing body 76 by the thermometer well assembly 78 and the end cap 80. The hermetically sealed housing body 76 is purged of moisture and filled with mineral oil to remove air and to provide improved thermal transfer. It should be noted that the element assembly 74 is of sufficient rigidity to eliminate measurable effects of external changes in barometric pressure changes.

FIGS. 4A through 4D are detailed side views of resistor elements 32 for the element assembly of FIG. 3 according to various embodiments of the present invention. FIGS. 4A-1, 4B-1, 4C-1 and 4D-1 are detailed end views of the resistor elements 32 shown in FIGS. 4A, 4B, 4C, and 4D, respectively. As shown, each of the resistor elements 32 is mounted on a fixture 52, 54, 56, 58, respectively, which supports the element 32 without mechanical strain and which provides thermal uniformity. As best seen in FIGS. 4A-1 through 4D-1, each fixture 52, 54, 56, 58 is constructed with a hollow core. An additional support may be inserted into the hollow core and used to secure the resistor element 32 within housing body 76. For example, as shown in FIG. 3, the thermometer well 82 is inserted into the hollow core for additional support. A temperature sensor (such as a glass encapsulated thermistor selected for high stability, among others) (not shown) is attached to the resistor element 32.

FIGS. 4A and 4A-1 illustrate a resistor element 32 comprised of an Evanohm® strip 38 placed over an insulating sleeve fixture 52. In the current embodiment, the Evanohm® strip 38 is connected to ends of copper lead wires 50 at a nickel-alloy interface 48. The other ends of the copper lead wires 50 are connected to the measurement terminals 25 (not shown in FIGS. 4A and 4A-1). In the current embodiment, the resistor element 32, having the Evanohm® strip 38, is constructed to have a resistance value between 0.001 and 1 ohms.

FIGS. 4B and 4B-1 illustrate a resistor element 32 comprised of an Evanohm® ribbon 40 over a mica strip fixture 54. The Evanohm® ribbon 40 is connected to ends of copper lead wires 50 at a nickel-alloy interface 48. The other ends of the copper lead wires 50 are connected to the measurement terminals 25 (not shown in FIGS. 4B and 4B-1). In the current embodiment, the resistor element 32, having the Evanohm® ribbon 40, is constructed to have a resistance value between 1 and 10 ohms.

FIGS. 4C and 4C-1 illustrate a resistor element 32 comprised of wire bifilar 42 wound on an insulating hollow cylinder fixture 56 cut with a double-helical groove. The wire bifilar 42 is connected to ends of copper lead wires 50 at a nickel-alloy interface 48. The other ends of the copper lead wires 50 are connected to the measurement terminals 25 (not shown in FIGS. 4C and 4C-1). In the current embodiment, the resistor element 32, having the bifilar wire 42, is constructed to have a resistance value between 10 and 100 ohms.

FIGS. 4D and 4D-1 illustrate a resistor element 32 comprised of insulated wire 44 wound on an ceramic bobbin fixture 58. The insulated wire 44 is connected to ends of copper lead wires 50 using nickel-alloy interface solder tabs 46. The other ends of the copper lead wires 50 are connected to the measurement terminals 25 (not shown in FIGS. 4D and 4D-1). In the current embodiment, the resistor element 32, having the insulated wire 44, is constructed to have a resistance value between 100 ohms and 10 megohms.

During manufacture, the baseline characteristics for each resistor element 32 are measured. For example, a resistor element's 32 actual resistance value, coefficients of temperature, drift due to age, and frequency response, as well as other factors which contribute to the resistor element's 32 uncertainty, are measured. These factors are then stored in memory 28, along with corresponding equations for temperature and frequency response. The digitally controlled resistance standard 10 uses this information to determine a resistance vs. temperature curve (among others) for each resistor element 32. The digitally controlled resistance standard 10 uses the resistance vs. temperature curve to adjust a resistor element's 32 actual resistance value to the nominal resistance value. For example, a user may select a nominal value of 1 ohm. The actual value of the resistor element 32, however, may be 0.95 ohms (i.e., a deviation 0.05 ohms) at a room temperature of 68° F. By raising the resistor element's 32 temperature to 70° F., the digitally controlled resistance standard 10 changes the resistor element's 32 resistance value to the nominal resistance (i.e., 1 ohm) and reduces the deviation from 0.05 ohms to zero ohms. It should be noted that additional information can be added to memory 28 by the measurement system or by the user (among others) during testing.

In the current embodiment, the digitally controlled resistance standard 10 has multiple resistance ranges that can be selected by the user during testing. A single resistor element 32 with a number of measurement points tapped off of a single piece resistor element 32 and a number of discrete resistor elements 32 having different resistance ranges, among others, may be used in the digitally controlled resistance standard 10 while remaining within the scope of the present invention.

In the current embodiment, resistor elements 32 are fabricated to a value close to a desired nominal value (e.g., 1 ohm, 10 ohms, 100 ohms, etc.). The value of the resistor elements 32 are measured at temperatures above and below a reference temperature to determine the resistor elements' 32 unique alpha and beta temperature coefficients. Measurements are also taken at various frequencies to determining the resistor elements' 32 frequency responses. The resistor elements 32 are then processed for stability (e.g., stress relieved) and final adjustments are made. The resistor element's 32 construction allows the manufacturer to readjust their value at a future time should, for example, a resistor element's 32 value change beyond desired limits due to age or damage. A series of measurements are then taken over a given time period to establish the drift rate of each resistor element 32. Uncertainties to all measurements are calculated and recorded during manufacture for each resistor element 32, for use in the digitally controlled resistance standard's 10 internal uncertainty calculator. In the current embodiment, user data fields for entering external measurement system uncertainties allow the user to maintain complete system uncertainty on the digitally controlled resistance standard 10.

It should be noted that other materials, construction methods, and configurations may be used to construct a resistor element 32 while remaining within the scope of the present invention. For example, manufacturing steps that are well know in the art, such as heat treating and stress relieving, among others, may be employed while remaining within the scope of the present invention. Additionally, the resistance value of the resistance element 32 may be varied while remaining within the scope of the present invention.

Figure 5A:
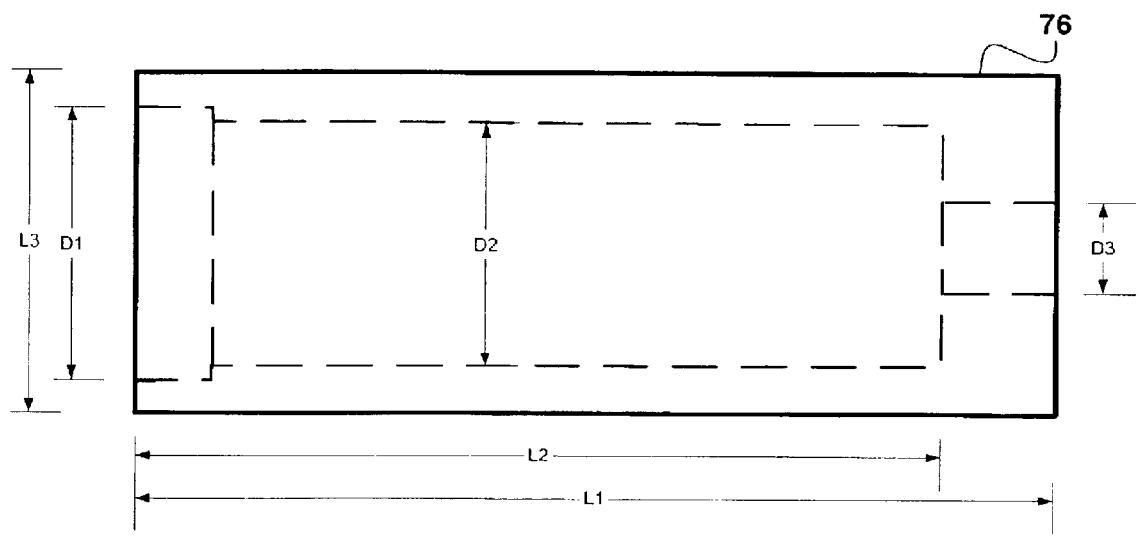
FIG. 5A illustrates a detailed view of the housing body of the element assembly of FIG. 3 according to an embodiment of the present invention.
Figure 5B:
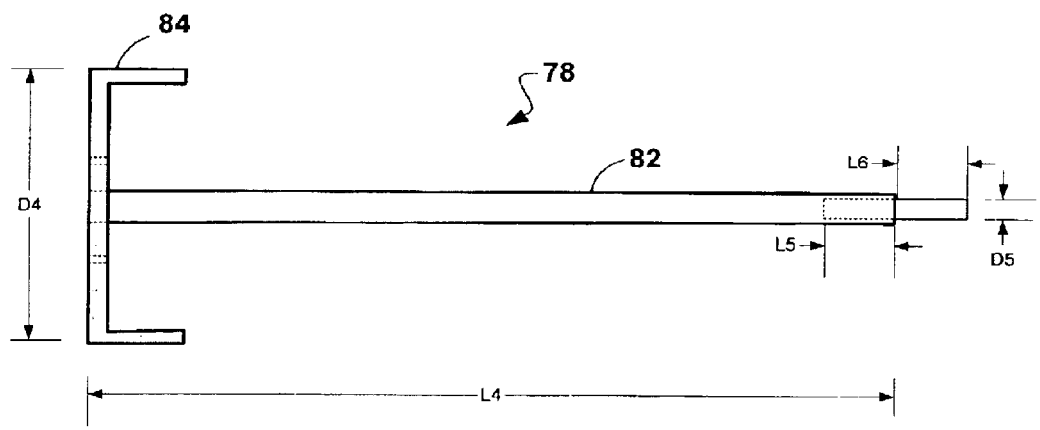
FIG. 5B illustrates a detailed view of the thermometer well assembly of the element assembly of FIG. 3 according to an embodiment of the present invention.
Figure 5C:
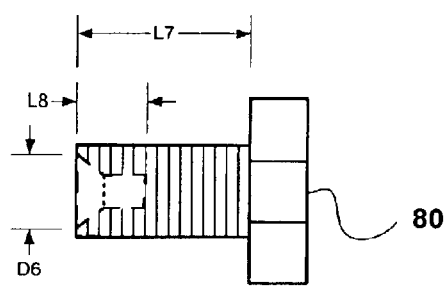
FIG. 5C illustrates a detailed view of the end cap of the element assembly of FIG. 3 according to an embodiment of the present invention.

FIGS. 5A through 5C illustrate detailed views of the component parts of the element assembly 74 of FIG. 3 according to an embodiment of the present invention. Specifically, FIG. 5A illustrates a detailed view of the housing body 76, FIG. 5B illustrates a detailed view of the thermometer well assembly 78, and FIG. 5C illustrates a detailed view of the end cap 80.

Referring now to FIG. 5A, in the current embodiment, the housing body 76 is machined from a single block of nickel plated copper. The first end of the housing body 76 is machined to accept the thermometer well assembly 78 and the second end of the housing body 76 is formed to accept the end cap 80. It should be noted that the shape of the element assembly 74 may be varied while remaining within the scope of the present invention.

In the current embodiment, the thermometer well assembly 78 is comprised of a hollow nickel plated copper well 82 with a proximal end soldered to a nickel plated copper flange 84. One or more holes are drilled through flange 84 to allow access to the interior of the thermometer well 82 and the interior of the housing body 76 (e.g., for lead wires, etc.). Once the element assembly 74 is assembled, the holes may be hermetically sealed to prevent external environmental factors from interfering with the operation of the resistor element 32. The well 82 provides access to the interior of the element assembly 74 for temperature sensing device, such as a thermometer (not shown), and may provide support for the resistor element 32 (as shown in FIG. 2) that is contained with the housing 76.

In the current embodiment, end cap 80 is comprised of a threaded bolt having a chamfered opening. The chamfered opening is sized to accept and support the distal end of well 82 when the element assembly 74 is assembled. The threads of end cap 80 are operable to engage a set of threads on the end of housing body 76. It should be noted that other configurations may be used for end cap 80 (for example, a flange, etc.) while remaining within the scope of the present invention.

Referring to FIG. 5A, in the current embodiment length L1 is equal to 6 inches (15.24 cm), L2 is equal to 5.75 inches (14.605 cm), and L3 is equal to 1.25 inches (3.175 cm). Diameter D1 is equal to 0.968 inches (2.45872 cm), D2 is equal to 0.875 inches (2.2225 cm), and D3 is equal to 0.375 inches (0.9525 cm). Referring to FIG. 5B, length L4 is equal to 5.0 inches (12.7 cm) and L5 and L6 are both equal to 0.500 inches (1.27 cm). Diameter D4 is equal to 0.967 inches (2.45618 cm) and D5 is equal to 0.125 inches (0.3175 cm). Referring to FIG. 5C, length L7 is equal to 1.0 inches (2.54 cm), L8 is equal to 0.500 inches (1.27 cm), and diameter D6 is equal to 0.375 inches (0.9525 cm). It should be noted that all dimensions provided for FIGS. 5A through 5C are exemplary and that other dimensions may be used while remaining within the scope of the present invention.

Figure 6A:
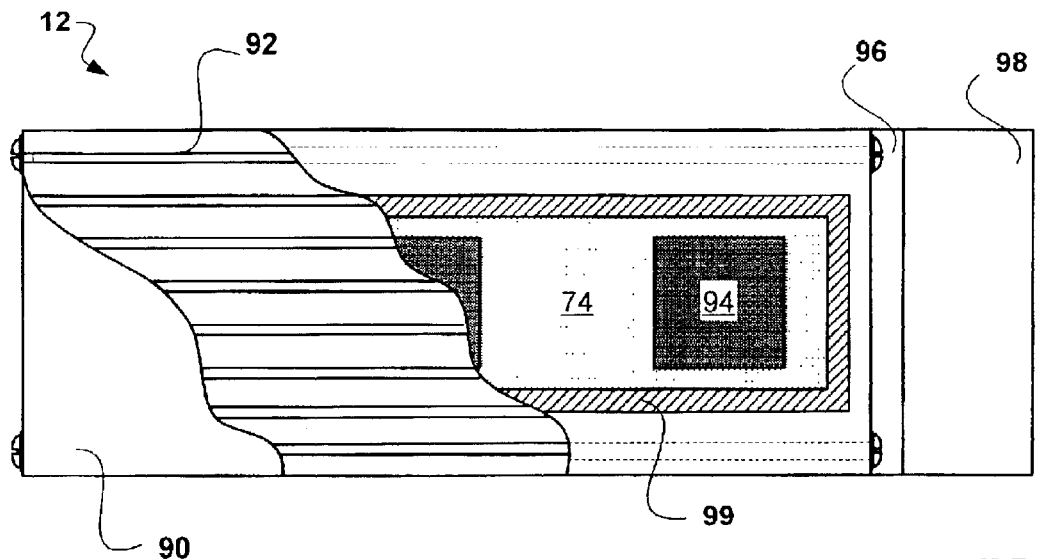
FIG. 6A is a cut-away view of the heating/cooling assembly of FIG. 1 according to an embodiment of the present invention.
Figure 6B:
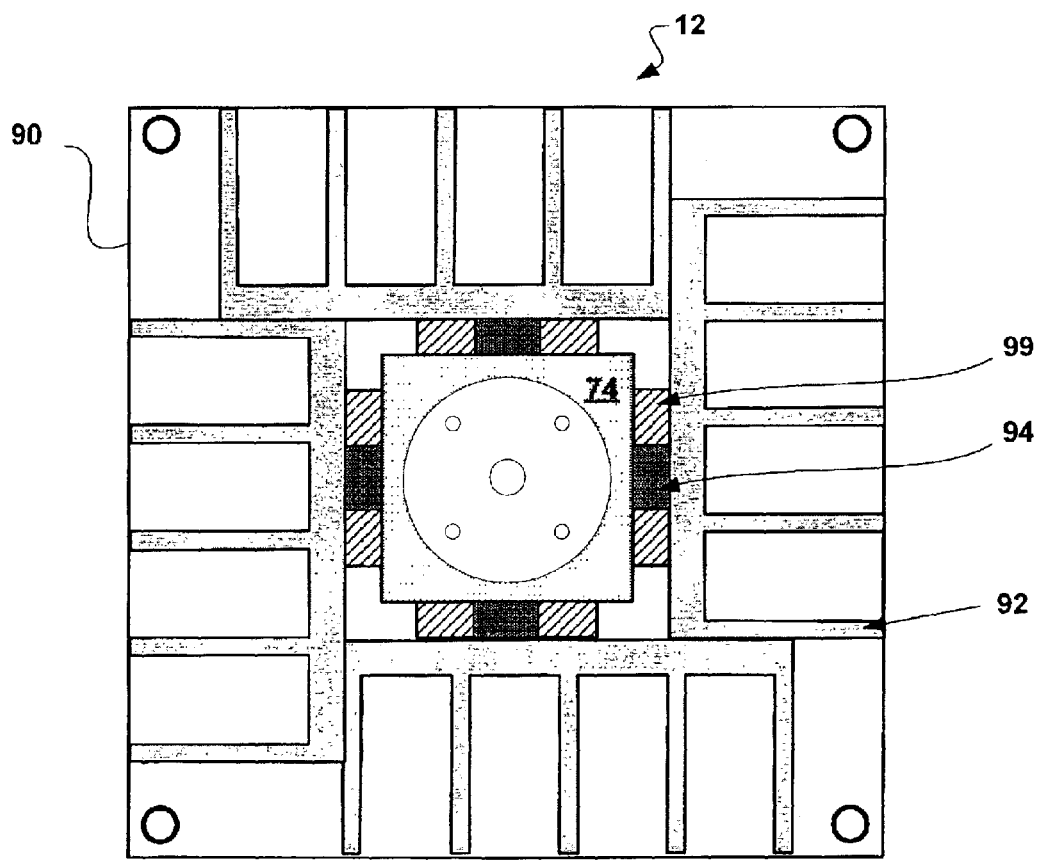
FIG. 6B is an end view of the heating/cooling assembly shown in FIG. 6A according to an embodiment of the present invention.

FIGS. 6A and 6B illustrate a cut-away view and an end view, respectively, of heating/cooling assembly 12 according to an embodiment of the present invention. In operation, it is desirable to maintain the resistor element 32 at a constant temperature. The heating/cooling assembly 12 is used to achieve and maintain the desired temperature.

Heating/cooling assembly 12 is comprised of a shell 90, heat sinks 92, thermoelectric modules 94, fan mount 96, fan 98, and insulation 99 among others. In the current embodiment, one or more thermoelectric modules 94 are carried by the element assembly 74, which is then surrounded by insulation 99. The thermoelectric modules 94, the element assembly 74, and the insulation 99 are surrounded by one or more heat sinks 92. The heat sinks 92, thermoelectric modules 94, the element assembly 74, and insulation 99 are placed within shell 90. A fan mount 96 is used to secure a fan 98 to one end of the shell 90. The fan 98 is operable to push or pull air across the heat sinks 92. It should be noted that a filter may be used to prevent contaminants from depositing on the heat sinks 92.

In normal operation, the temperature of the resistor element 32 is sensed by a temperature sensing device (such as a glass encapsulated thermistor). In the current embodiment, the thermoelectric modules 94 are Peltier-effect devices which generate heat on one surface and remove heat from the opposite surface when a current is applied (note: reversing the current's polarity causes the first side to remove heat and the opposite side to generate heat). Thus, if the temperature of the resistor element 32 is too low, current is applied to the thermoelectric modules 94 such that the element assembly 74 is heated, and thus, the temperature of the resistor element 32 increases. If the temperature of the resistor element 32 is too high, current (with the opposite polarity) is applied to the thermoelectric modules 94 such that the element assembly 74 is cooled, and thus, the temperature of the resistor element 32 decreases. Additionally, fan 96 may be activated to help regulate the element assembly 74 temperature, and thus, the resistor element 32 temperature.

It should be noted that multiple heating/cooling assemblies 12, each containing an element assembly 74 having a different magnitude resistance range (for example, 0.01–1 ohm, 1–10 ohm, 10–100 ohm, and 100–1M ohm, etc.), may be used within the digitally controlled resistance standard 10. Additionally, a single heating/cooling assembly 12 containing a multitude of different magnitude element assemblies 74 or a single element 32 with multiple tap points may be used while remaining within the scope of the present invention. Thus, the user is able to select the desired resistance range needed for testing.

Figure 7:
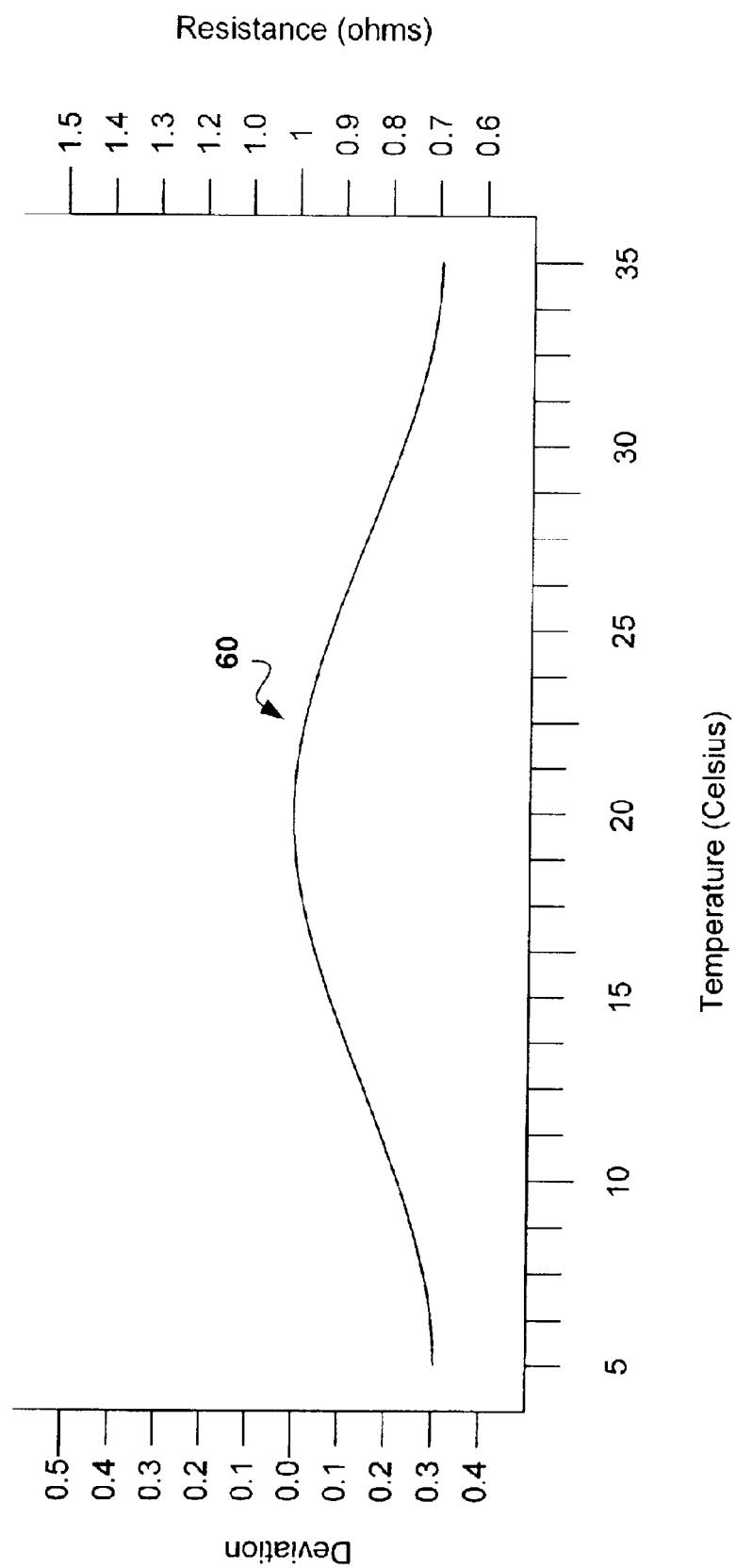
FIG. 7 illustrates a resistance/temperature curve for a typical resistor element according to an embodiment of the present invention.

FIG. 7 illustrates a resistance/temperature curve 60 for a resistor element 32 according to an embodiment of the present invention. As previous discussed, the actual value of the resistor element 32 is measured during manufacture. The resistor element's 32 coefficients of temperature, drift due to age, and frequency response are determined, as well as other factors which contribute to the resistor element's 32 uncertainty. These factors are then stored in the memory 28, along with corresponding equations for temperature and frequency response. These and other measurements are used to determine a resistor element's 32 resistance/temperature curve 60.

In the current embodiment, the digitally controlled resistance standard 10 uses the resistance/temperature curve 60 to accurately adjust the resistor element's 32 actual resistance to a nominal resistance. Referring to FIG. 7 for example, when the resistor element 32 is at 68° F., the resistor element 32 has an actual resistance of 0.95 ohms (i.e., a deviation 0.05 ohms). By raising the resistor element's 32 temperature to 70° F., the digitally controlled resistance standard 10 changes the resistor element's 32 resistance value to the nominal resistance (i.e., 1 ohm) and reduces the deviation from 0.05 ohms to zero ohms.

Figure 8:
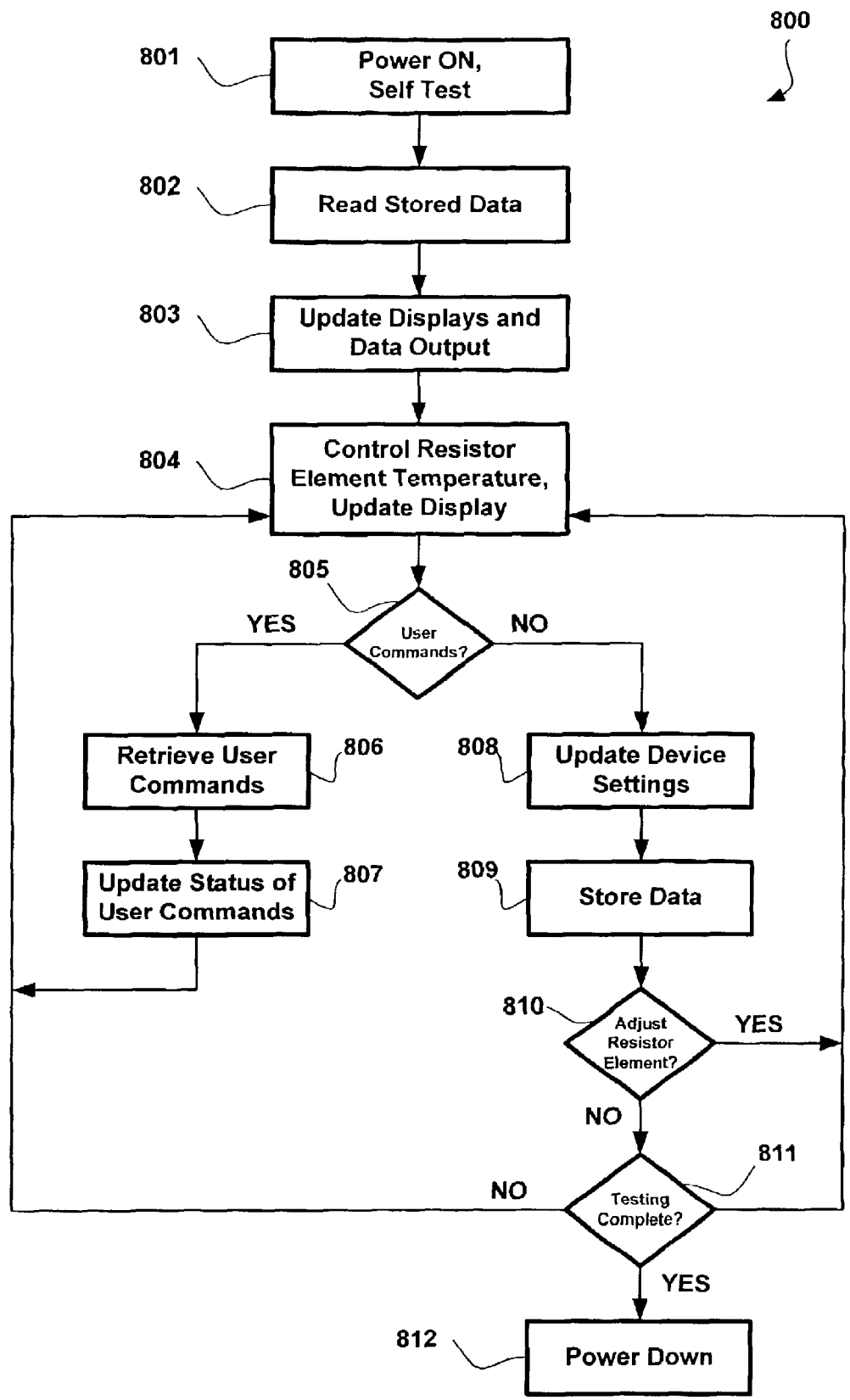
FIG. 8 illustrates an operational process for the digitally controlled resistance standard of FIG. 1 according to an embodiment of the present invention.

FIG. 8 illustrates an operational process 800 for the digitally controlled resistance standard 10 of FIG. 1 according to an embodiment of the present invention. Operational process 800 is initiated by operation 801. Operation 801 powers up and initiates a self-test sequence for the digitally controlled resistance standard 10. The self-test sequence may include, for example, testing of CPU functions, memory integrity, and I/O status, as well as other tests typical to microcomputers. After the power is turned on and self-test sequence is completed, operational control is passed to operation 802.

Operation 802 retrieves relevant data stored within the memory 28 of the digitally controlled resistance standard 10. Data stored in the memory 28 may include manufacturer's data, secured user data, and last user data, among others. Manufacturer's data may include, for example, information related to the resistor element 32 (such as the serial number, date of manufacture, uncertainty components, temperature coefficients, frequency response, upper and lower deviation limits, and drift rate of the resistor element 32, among others) and equations used to control the resistance standard 10 (such as a three-mode PID control equation and temperature coefficient equation, among others). Secured user data may include calibration data, user ID information, nominal value, nominal temperature, and uncertainty data, among others. Last user data may include element selection and deviation selection, among others.

Operation 803 assumes control after operation 802 retrieves the relevant data from memory 28. Operation 803 uses, for example, the results of the self-test sequence completed by operation 801 and the relevant data retrieved by operation 802 and updates the displays 24. Operation 803 may also calculate and display uncertainty information related to each component and the expanded uncertainty for the system. Operation 803 may also output relevant data to the user via a printer, chart recorder, and communications link, among others. After operation 803 updates the displays 24, operational control is the passed to operation 804.

Operation 804 alters the temperature of the resistor element 32 until it reaches a desired point. For example in the current embodiment, operation 804 utilizes the temperature/ frequency measurement circuit 14 to determine the actual temperature of the resistor element 32. If the resistor element's 32 actual temperature deviates from the desired temperature, operation 804 activates the thermoelectric modules 94 to heat or cool the resistor element to the desired level. In addition to controlling the resistor element's 32 temperature, operation 804 continuously updates the values shown on the displays 24.

After the temperature of the resistor element 32 reaches the desired level, operational process 805 determines whether any user commands have been entered. If user commands are present, operational control branches YES and operation 806 assumes control. Operation 806 retrieves the user commands (for example, the nominal resistance value, element selection, etc.). Operational 807 then updates the status of the user commands in memory 28. After the status of the user commands are updated, operational control is returned to operation 804.

If user commands are not present, operational control branches NO and operation 808 assumes control. Operation 808 updates the device settings. Device settings include the temperature settings used to achieve a desired resistance value, the calculation of displayed and data output resistance values corrected for the frequency of an applied signal, the age of the resistance element and application of correction to compensate for drift, the application of uncertainty calculations, and the update of display/output of a calculated expanded uncertainty, among others.

Operation 809 stores the updated device settings in the memory 28. After the updated device settings are stored, operation 810 determines whether the actual temperature of the resistor element 32 needs to be adjusted. Control branches YES and operation 804 assumes control if the actual resistance value of the selected resistance element 32 needs to be adjusted to match the desired nominal resistance value. Control branches NO and operation 811 assumes control if the actual resistance value of the selected resistance element 32 does not need to be adjusted.

Operation 811 determines whether the testing is complete. If testing is not complete, operational control branches NO and operation 804 assumes control. If testing is complete, operational control branches YES and operation 812 assumes control. Operation 812 powers down the digitally controlled resistance standard 10.

It should be recognized that the above-described embodiments of the invention are intended to be illustrative only. Numerous alternative embodiments may be devised by those skilled in the art without departing from the scope of the following claims. For example, a non-digital resistance standard (e.g., a resistance standard implemented using analog circuitry) may be employed while remaining within the scope of the present invention.

What is claimed is:

1. A method for improving the accuracy of a resistance standard having a resistor element, comprising:
   ascertaining baseline characteristics for a said resistor element;
   determining an actual resistance value of said resistor element;
   selecting a target resistance value for said resistor element; and
   adjusting said actual resistance value of said resistor element to match said target resistance value for said resistor element, wherein said adjusting said actual resistance value includes increasing and decreasing said resistance element's temperature.

2. The method of claim 1 further comprising:
   correcting said actual resistance value for frequency, age, power, and expanded uncertainty.

3. The method of claim 1 wherein said ascertaining baseline characteristics for said a resistor element further comprises at least one of:
   determining said resistor element's coefficients of temperature;
   determining said resistor element's frequency response;
   determining said resistor element's drift due to age; and
   calculating said resistor element's expanded uncertainty.

4. The method of claim 1 wherein said determining said actual resistance value of said resistor element further comprises:
   determining said resistor element's temperature;
   determining an applied measurement signal's frequency;
   determining an applied measurement signal's power;
   determining said resistance element's age; and
   calculating said actual resistance of said resistance element using at least one of said resistor element's temperature, said resistor element's age, said resistor element's baseline characteristics, and said applied measurement signal's power.

5. The method of claim 1 wherein said adjusting the actual resistance value of the resistor element comprises:
   increasing or decreasing the temperature of said resistor element in response to said resistor element's baseline characteristics.

6. A self-adjusting resistance standard, comprising:
   a resistor element, said resistor element being sealed within an element assembly;
   a temperature and frequency measuring circuit operable to measure the temperature of said resistor element and a frequency of an applied measurement signal;
   a heating/cooling assembly operable to raise and lower a temperature of said resistor element;
   a temperature controller for controlling said heating/cooling assembly; and
   a control system responsive to said measuring circuit to control said heating/cooling assembly to maintain the value of said resistor element.

7. The self-adjusting resistance standard of claim 6 wherein said control system comprises a processing unit operable to at least one of:
   store baseline characteristics for said resistor element, wherein said baseline characteristics include at least one of said resistor element's temperature characteristics, frequency response, power coefficient, age, drift characteristics, and uncertainty components;
   retrieve said baseline characteristics for said resistor element;
   retrieve the temperature of said resistor element from said temperature and frequency measuring circuit;
   retrieve the frequency of an applied measurement signal from said frequency measuring circuit;
   retrieve the applied power of said measurement signal;
   calculate expanded uncertainties;
   determine the actual resistance value of said resistor element;
   display and output said actual resistance value;
   display and output said calculated expanded uncertainty; and
   control said heating/cooling assembly to adjust the actual resistance value of said resistor element to match a target resistance value.

8. The self-adjusting resistance standard of claim 6 further comprising at least one of:
   a display responsive to said control system;
   a memory responsive to said control system;
   a power supply operable to power at least one of said control system, said temperature and frequency measuring circuit, said temperature controller, and said heating/cooling assembly;

shielding operable to protect at least one of said memory, said power supply, said control system, said temperature and frequency measuring circuit, said temperature controller, and said heating/cooling assembly; and a chassis for housing said display, said memory, said power supply, said control system, said temperature and frequency measuring circuit, said temperature controller, and said heating/cooling assembly.

9. The self-adjusting resistance standard of claim 6 wherein said resistor element further comprises a resistive material carried by a support fixture.

10. The self-adjusting resistance standard of claim 9 wherein said resistive material is comprised of at least one of Evanohm® and Manganin.

11. The self-adjusting resistance standard of claim 9 wherein said resistive material is in the form of at least one of a strip, a wire, and a ribbon.

12. The self-adjusting resistance standard of claim 9 wherein said support fixture is comprised of at least one of an insulating sleeve, a mica strip, an insulating hollow cylinder, and a ceramic bobbin.

13. The self-adjusting resistance standard of claim 6 wherein said element assembly further, comprises:

a housing body having a first and second end;

a thermometer well assembly having a thermometer well with a first end connected to a flange and a distal end, said thermometer well assembly operable to seal said first end of said housing body; and an end cap having a chamfered end for accepting said distal end of said thermometer well, said end cap operable to seal said second end of said housing body.

14. The self-adjusting resistance standard of claim 6 wherein said heating/cooling assembly further comprises:

a thermoelectric module carried by said element assembly;

an insulating material carried by said element assembly;

a heat sink carried by said insulating material;

a shell surrounding said heat sink, and a fan operable to effect air flow with said shell across one or more surfaces of said heat sink.

15. The self-adjusting resistance standard of claim 14 wherein said temperature controller further comprises:

a processor operable to execute a tuned temperature control algorithm, said algorithm generating a numerical error signal;

a digital-to-analog converter operable to convert said numerical error signal into an analog signal; and a bipolar power amplifier responsive to said numerical error signal, an output of said bipolar amplifier being connected to said thermoelectric module.

16. A method for improving the accuracy of a resistor standard having a resistor element, comprising:

determining a resistance/temperature curve for said resistor element;

measuring a first temperature of said resistor element;

ascertaining an actual resistance value of said resistor element;

selecting a second temperature for said resistor element, wherein said second temperature corresponds to a target resistance value; and adjusting the temperature of said resistor element to said second temperature, said actual value of said resistor element being matched to said target resistance value.

17. The method of claim 16 wherein said determining said selecting a second temperature for said resistor element comprises at least one of:

determining said resistor element's coefficients of temperature;

measuring said resistor element's frequency response;

determining said resistor element's power coefficient;

determining said resistor element's drift due to age; and calculating said resistor element's expanded uncertainty.

18. The method of claim 16 wherein said ascertaining an actual resistance value for said resistor element comprises selecting the resistance value on said resistance/temperature curve that corresponds to said first temperature.

19. The method of claim 16 wherein said adjusting the temperature of said resistor element to said second temperature comprises using a Peltier-effect device to apply heat to and remove heat from said resistance element.

20. The method of claim 16 wherein said adjusting the temperature of said resistor element to said second temperature further comprises:

ascertaining the self-heating baseline characteristics of said resistor element; and compensating for the self-heating of said resistor element.

* * * * *